US006928626B1

(12) United States Patent
McGaughy et al.

(10) Patent No.: US 6,928,626 B1
(45) Date of Patent: Aug. 9, 2005

(54) SYSTEM AND METHOD FOR MODELING OF CIRCUIT COMPONENTS

(75) Inventors: Bruce W. McGaughy, Fremont, CA (US); Jun Qian, Fremont, CA (US); Jun Kong, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 87 days.

(21) Appl. No.: 10/313,061

(22) Filed: Dec. 6, 2002

(51) Int. Cl.[7] .............................................. G06F 17/50

(52) U.S. Cl. ...................... 716/1; 716/2; 716/7; 716/16

(58) Field of Search ............................. 716/1, 2, 7, 16, 716/8; 257/17

(56) References Cited

U.S. PATENT DOCUMENTS

| 5,812,414 A | * | 9/1998 | Butts et al. ................... 716/16 |
| 6,077,308 A | * | 6/2000 | Carter et al. ................... 716/8 |
| 6,559,470 B2 | * | 5/2003 | Tsu-Jae ........................ 257/17 |

OTHER PUBLICATIONS

Devgan, A. et al. (Jun. 1994). "Adaptively Controlled Explicit Simulation,"*IEEE Transactions on Computer Aided Design of Integrated Circuits and Systems*, 13(6):746-762.
Devgan, A. (1995). "Accurate Device Modeling Techniques for Efficient Timing Simulation of Integrated Circuits,"*IEEE* pp. 138-143.
Devgan, A. et al. (Jan. 1995). "Efficient Simuation of Interconnect and Mixed Analog-Digital Circuits in ACES," *IEEE 8th International Conference on VLSI Design*, pp. 229-233.
Devgan, A. (Nov. 1996). "Transient Simulation of Integrated Circuits in the Charge-Voltage Plane,"*IEEE Transactions on Computer-Aided Design of Integrated Circuits and Systems*, 15(11):1379-1390.
Liu, W. (2001). *MOSFET Models for SPICE Stimulation Including BSIM3v3 and BSIM4*, John Wiley & Sons, Inc., Table of Contents only, pp. vii-x.
Rumbaugh, J. et al. (1991). "Introduction," Chapter 1 *In Solutions Manual: Object Oriented Modeling and Design*, Prentice Hall, Inc., pp. 1-6 (Includes Table of Contents).
Wolf, S. (1995). "The Submicron MOSFET,"*In Silicon Processing for the VLSI Era*, vol. 3, Lattice Press, Table of Contents only, pp. v-xx.

* cited by examiner

*Primary Examiner*—Thuan Do
(74) *Attorney, Agent, or Firm*—Morrison & Foerster LLP (57) ABSTRACT

The present invention relates generally to the field of design automation. More particularly, the present invention relates to a system and method for the modeling of circuit components for use by a simulator. The present invention includes a model of a circuit component having a plurality of properties that depend on at least two variables comprising: a space defined by the two or more variables; a partition of said space comprising a plurality of regions wherein at least two of the properties share said partition; and at least one definition representing at least one of the properties in at least one of the regions.

20 Claims, 8 Drawing Sheets

SYSTEM AND METHOD FOR MODELING OF CIRCUIT COMPONENTS

FIELD OF THE INVENTION

The present invention relates generally to the field of design automation. More particularly, the present invention relates to a system and method for the modeling of circuit components for use by a simulator.

BACKGROUND OF INVENTION

Simulation is an indispensable verification step before committing an integrated circuit to an expensive manufacturing process. Over the years, a hierarchy of simulation techniques have been developed to keep pace with the growing complexity of integrated circuits. But the need to perform simulations on increasingly large circuits coupled with the growing analog nature of integrated circuit behavior has stretched the limits of conventional simulation methodologies. Circuit-Level simulators, such as SPICE and ASX, provide utmost accuracy, but with excessive memory and time costs which may be prohibitive.

Over the past few decades the number of transistors that can be incorporated into a single integrated circuit (IC) has risen at a dramatic rate. Unfortunately, as the complexity of ICs increases, so does the likelihood of design errors and the difficulty of detecting and identifying those errors. Consequently, designers have become dependent upon simulation programs to predict the behavior of ICs prior to their actual fabrication. These simulation programs make it possible to verify that an IC conforms to logical and timing specifications before committing the vast resources necessary to build it. Lower level simulators utilize more detailed descriptions of the design and provide greater accuracy and flexibility. But these lower level simulators have a lower efficiency, thereby limiting the size of the circuit designs that they can simulate. In contrast, higher level simulators utilize simplified models to represent the behavior of collections of lower level objects. Because they do not consider many of the lower level details, higher level simulators can execute larger designs more efficiently. But higher level simulators have lower accuracy and flexibility. Accordingly, simulation involves tradeoffs and the design process usually includes simulation at many different levels.

Circuit-Level simulators represent the IC as a network of lumped, possibly nonlinear, transistors, resistors, inductors, capacitors, and current and voltage sources. To describe the behavior of this network, Kirchoff's voltage and current laws are used to formulate a system of coupled nonlinear differential equations. This system of equations is solved using time advancement numerical integration. This simulation technique places few restrictions on the circuit topology and utilizes general non-linear transistor models. In addition, the numerical integration procedure allows the computation of the detailed time step by time step behavior of any electrical variable in the circuit. The accuracy of the integration algorithms is limited only by numerical considerations, which are almost always insignificant compared to the precision with which components can be fabricated on an IC. Circuit-Level simulation is flexible and accurate and has proven to be the most general and reliable technique for estimating the transient response of ICs. Because of their detailed accuracy and flexibility, however, Circuit-Level simulators require a large amount of both memory and time. These requirement result from the inefficiency of processing the entire circuit simultaneously. The general models and topologies require algorithms whose execution time grows exponentially with the circuit size, thereby making their use impractical for large ICs.

In an attempt to accelerate the simulation of large ICs, another generation of Circuit-Level simulators has emerged. These simulators use simplified circuit models and decomposition techniques to partition the IC into smaller pieces that can be analyzed independently. Partitioning achieves several results. First, it allows the formulation and analysis of more moderately sized systems of equations. Second, it opens up the possibility of multi-rate simulation (i.e., the selection of different time steps for different portions of the IC). Third, it becomes possible to completely bypass the analysis of latent sub-circuits (i.e., sub-circuits that are not actively switching). In general, this newer generation of Circuit-Level simulators achieves speed-ups of up to two orders of magnitude over their predecessors. Unfortunately, restricted circuit models and reliability problems have impeded widespread acceptance of this newer generation of circuit level simulators. Furthermore their speedups, although impressive, are limited by their use of numerical integration. Time advancement numerical integration requires that time be advanced in steps and the size of these steps is limited by the need to maintain accuracy and stability.

In contrast, a second type of simulator, a Gate-Level simulator, represents the IC as a network of gates at a higher level in the simulator hierarchy. In this simulator, a gate is an object that represents a collection of transistors. The primary advantage of Gate-Level simulation is efficiency. But disadvantages result from the requirement that the circuit must be partitioned into a number of pre-characterized gates. In particular, custom circuit designs often contain structures whose behavior is not easily modeled by pre-characterized gates. Further, the configuration of circuit gate characteristics must usually be performed manually, a step which can be time consuming and prone to error.

Another form of simulator operates on a switch level circuit. The Switch-Level circuit is a network of transistors that are modeled by voltage controlled switches. Each switch has an associated resistance representing the current driving capabilities of the transistor. This switched-resistance model consists of the series combination of a resistor and a voltage controlled switch. Because the circuit is not partitioned into gates, Switch-Level simulators eliminate the manual configuration step and can simulate a wider variety of circuits than Gate-Level simulators. In addition, the Switch-Level simulators execute significantly faster than Circuit-Level simulators. Instead of modeling the behavior of devices using nonlinear models and computing the response of the networks using numerical integration, the Switch-Level simulators model the devices using simple linear device models and compute the response of circuits using moment analysis. Moment analysis has the advantage over time advancement numerical integration in that the response is computed once for all time rather than at numerous points in time. Overall, the primary advantage of Switch-Level simulators is their efficiency, which allows speedups of more than three orders of magnitude. Furthermore, because they restrict the topology of networks, Switch-Level algorithms have complexities which grow linearly with the size of the circuit, making them suitable for large IC simulation. The disadvantage of Switch-level simulators is their inflexibility. Simple switched resistor models are unsuitable for some MOS digital circuits, and for most ECL and BiCMOS circuits. Limitations may arise from the use of overly simplistic transistor models. The Switch-Level model was initially developed for the simulation of MOS circuits, and works well for the static MOS logic which makes up most of the digital MOS ICs. Occasionally, however, there are small portions of an IC whose behavior cannot be modeled well by a network of switches. These portions must be simulated at the Circuit-Level, thus complicating the verification of the design. Accordingly, there remains a need for a model of a component in a circuit that achieves high simulation accuracy without requiring an excessive amount of time or memory.

SUMMARY OF THE INVENTION

The present invention includes a model of a component in a circuit that achieves high simulation accuracy without requiring an excessive amount of time or memory. In particular, the present invention includes a model of a circuit component having a plurality of properties that depend on at least two variables comprising: a space defined by the two or more variables; a partition of said space comprising a plurality of regions wherein at least two of the properties share said partition; and at least one definition representing at least one of the properties in at least one of the regions.

The present invention further includes a method for creating a model of a circuit component having a plurality of properties that depend on two or more variables comprising the steps of: defining a space of the two or more variables; determining a plurality of borders forming a partition of said space comprising a plurality of regions, wherein at least two of the properties share said partition; and determining at least one definition representing at least one of the properties in at least one of the regions.

DETAILED DESCRIPTION OF THE INVENTION

Figure 1:
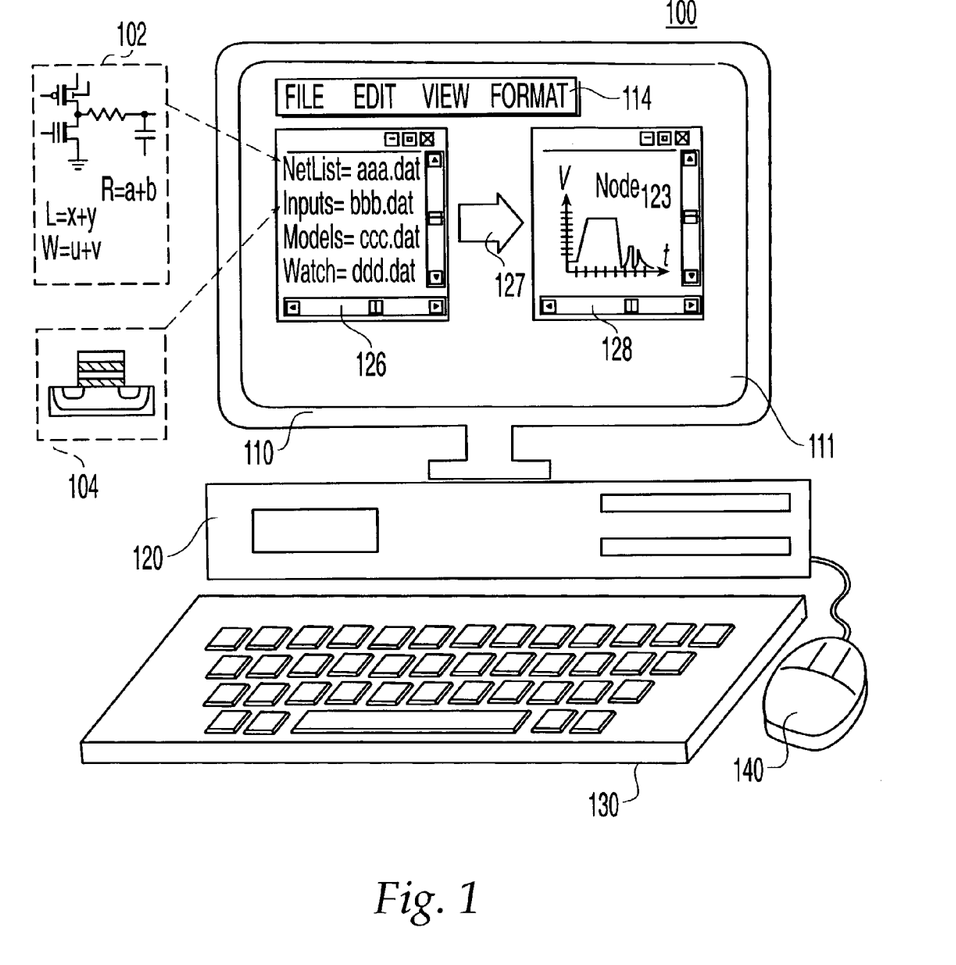
FIG. 1 illustrates a perspective view of a computer system 100 that is configured to perform circuit simulation using the models of the present invention.

FIG. 1 illustrates a perspective view of a computer system 100 that is configured to perform circuit simulation using the models of the present invention. Computer system 100 may include display monitor 110, computer housing 120, keyboard 130, and mouse 140. User input and output devices 110, 130, and 140 represent examples. Other input devices and output devices may be used in addition to or in place of the illustrated examples.

Display monitor 110 may include a display screen 111 that may depict a number of graphical items including a desktop layer and overlying windows generated by an application window 114. The application window 114 may contain information belonging to an executing circuit simulation program. A first subwindow 126 shows a list of input files that the simulation program may receive, while a second subwindow 128 shows a result that the simulation program may produce. Icon 127 represents the time consumed and the computational resources used by the simulation program from the time when all required input files 126 are supplied to the time when the desired result data 128 is produced. The example in subwindow 128 shows a voltage versus time plot for a watched node, which is identified as Node $_{123}$. The result data 128 produced by the simulator may represent many other forms of behaviors for the system that is to be manufactured.

One of the input files 126 may be a net list (e.g., NetList=aaa.dat), which describes the primitive components to be included, the geometric dimensions to be used for such primitive components, and the interconnections (circuit topology) to be made between the various components of the circuit to be simulated. Another input file 126 (e.g., Inputs=bbb.dat) may represent a set of testing vectors that are to be applied to the circuit for testing its behavior under given conditions. Another input file 126 (e.g., Models—ccc.dat) may define the mathematical or graphical models of the present invention for the various components or sub-components of the circuit. Another input file 126 (e.g., Watch=ddd.dat) may identify specific nodes or other parts of the circuit that are to be watched and may describe which aspects of their behaviors are to be displayed in the output window 128 (e.g., current versus time, power versus time, temperature versus time).

Box 102 of FIG. 1 schematically illustrates a possible portion of a net list. In box 102, different kinds of transistors (e.g., P-channel MOSFETs, N-channel floating gate MOSFETs) and their connections between their source, drain, gate, and bulk (substrate) terminals are shown. Also shown are connections to other components or signal sources. The other components may include resistances and capacitances, including parasitic resistances and capacitances of interconnect lines. Physical attributes of the various components may be expressed symbolically within the source net list 102. The resistance R of the illustrated resistance component may be symbolically expressed as R=a+b, where 'a' and 'b' may be variables or constants whose sum is to be resolved at compile time. In a similar way, channel length and width attributes of a given transistor may be symbolically expressed within the source netlist 102 as L=x+y and W=u+v respectively, where 'x', 'y', 'u', and 'v' may be variables or constants. The values of the variable may be resolved at compile time.

Each primitive component of box 102 may have a corresponding model as defined in box 104. The models of the present invention may be software structures that are used for predicting the local behavior of their corresponding components. One of the illustrated components in box 102 is a floating gate transistor. Its corresponding model is represented schematically in box 104. Some models may apply to p-type transistors and other models may apply to other types of components. The models represented in box 104 may be of many different kinds, including sets of differential equations for supporting simulators such as SPICE and ASX. The models may also be of the Piece wise linear (PWL) type. Different models may be selected depending on the speed and accuracy that are desired in the simulation.

Figure 2:
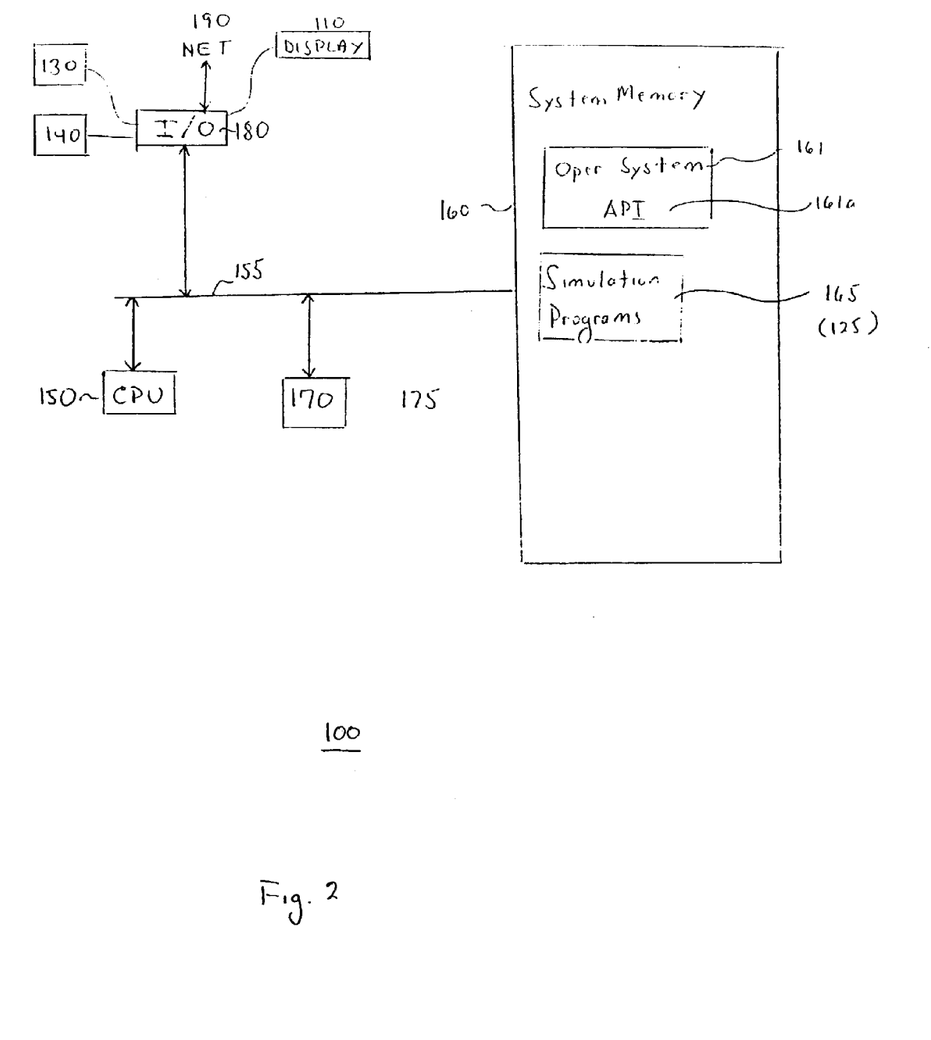
FIG. 2 schematically illustrates a possible configuration of computer system 100.

FIG. 2 schematically illustrates a possible configuration of computer system 100. Computer system 100 may include a central processing unit (CPU) 150 or other data processing means (e.g., plural processors), and a system memory 160 for storing executable instructions and accessible data for the CPU 150 or other processors. System memory 160 may take the form of DRAM (dynamic random access memory) and cache SRAM (static random access memory). Other forms of such memory may also be used. A system bus 155 may be used to operatively interconnect the CPU 150 and the system memory 160.

Computer system 100 may further include non-volatile mass storage means 170 such as a magnetic hard disk drive, a floppy drive, a CD-ROM drive, a re-writeable optical drive, or the like that is operatively coupled to the system bus 155 for transferring instructions and/or data. Instructions for execution by the CPU 150 (or other processors) may be introduced into system 100 by way of computer-readable media 175 such as a floppy diskette or a CD-ROM optical platter or other devices.

Computer system 100 may further include input/output (I/O) means 180 to interface the system bus 155 with peripheral devices such as display 110, keyboard 130 and mouse 140. The I/O means 180 may interface to a communications network 190 such as an Ethernet network, a SCSI network, a telephone network, a cable system, or the like. Instructions for execution by the CPU 150 and/or data structures for use by the CPU 150 may be introduced into computer system 100 by way of data signals transferred over communications network 190. Communication network 190 may therefore define a means for coupling to, and causing computer system 100 to perform operations.

System memory 160 may hold executing portions 161 of an operating system (OS) and of any executing parts of application programs 165. The application programs 165 generally communicate with the operating system by way of an API (application program interface) 161a. One of the application programs 165 may be a circuit simulator 125. System memory 160 may also include various data structures for causing computer system 100 to perform various operations.

Figure 3A:
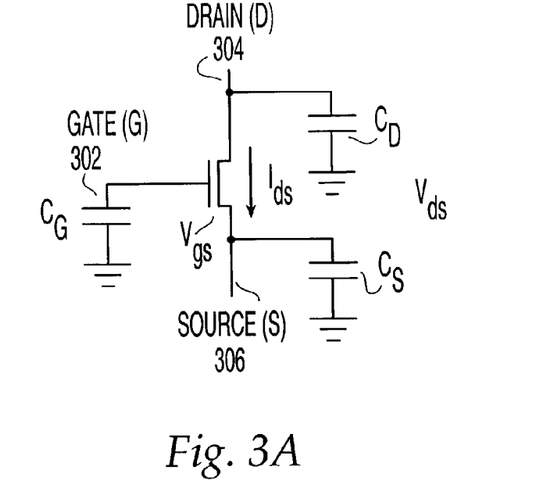
FIGS. 3A and 3B illustrate representations of a MOS transistor, which is one of the components that may be modeled by the present invention.
Figure 3B:
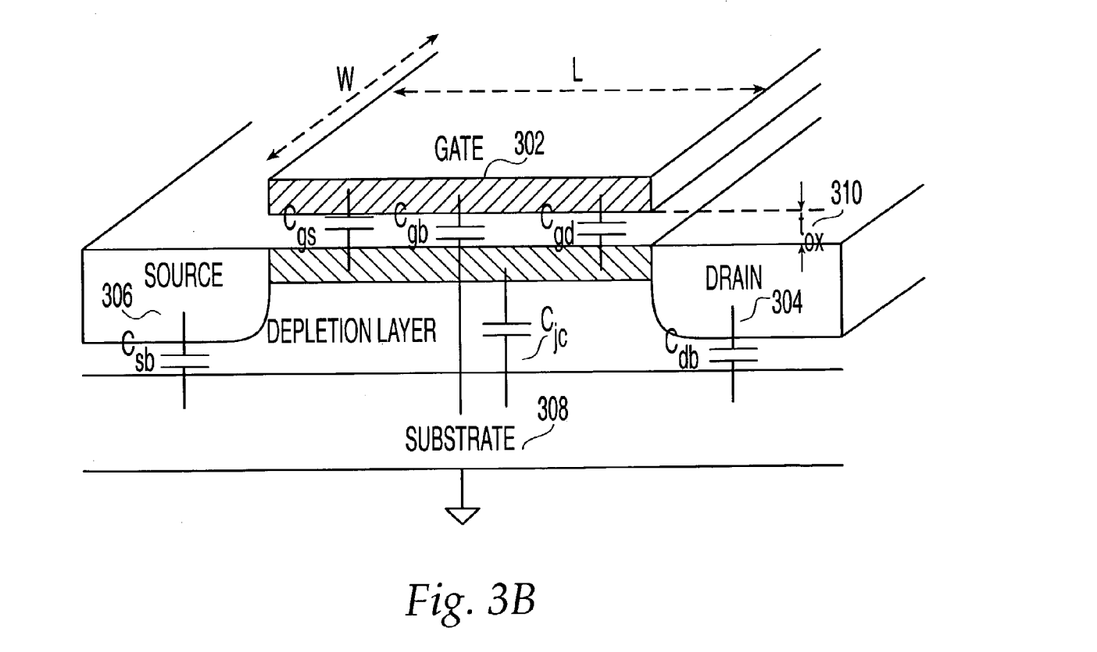

FIGS. 3A and 3B illustrate representations of a MOS transistor, which is one of the components that may be modeled by the present invention. A MOS transistor may act as a voltage controlled switch. The voltage applied to the gate 302 may control the passage of current between the drain 304 and source 306. One parameter of interest, the threshold voltage ($V_t$), is the voltage at which the MOS transistor begins to conduct (i.e., "turn on"). Other transistor parameters include the gate-to-source voltage ($V_{gs}$) and the drain-to-source voltage ($V_{ds}$). $V_{gs}$ is the voltage difference between the gate 302 and source 306 of the transistor while $V_{ds}$ is the voltage difference between the drain 304 and source 306. Another parameter is the drain-to-source current ($I_{ds}$). $I_{ds}$ depends on the difference between the voltages applied to the drain 304 and source 306 as well as the voltage applied to the gate 302.

Here, a linear model of the MOS transistor is described. But a non-linear model could also be used with the present invention. Such a non-linear model is described in Stanley Wolf, "Silicon Processing for the VLSI Era", Volume 3: The Submicron MOSFET, 1995, Lattice Press, the contents of which are herein incorporated by reference. Such a non-linear model is further described in William Liu, "MOSFET Models for SPICE Simulation including Bsim3v3 and Bsim4, 2001, John Wiley & Sons, Inc. A non-linear model is preferred for short channel MOSFET circuits.

The MOS transistor conducts current when $V_{gs}$ is equal to or greater than $V_t$. When $V_{gs}$ is less than $V_t$, the transistor is in the "cutoff" region—during which $I_{ds}$ is essentially zero. When $V_{gs}$ is equal to $V_t$ and when $V_{ds}$ is applied between the source 306 and drain 304, the horizontal and vertical components of the electrical field due to $V_{ds}$ and $V_{gs}$ interact, inducing a current $I_{ds}$. When the effective gate voltage ($V_{gs}$-$V_t$) is greater than the drain 304 voltage, the transistor exhibits a "linear" characteristic, where $I_{ds}$ is a function of both the gate 302 and drain 304 voltages. When $V_{ds}$>$V_{gs}$-$V_t$, the transistor is in "saturation" region. $I_{ds}$ has different properties in each of these different regions. The following are the ideal equations for $I_{ds}$ in the different regions for an nMOS transistor.

| | | |
|---|---|---|
| Cutoff: | $I_{ds} = 0$ | $V_{gs} \leq V_t$ |
| Linear: | $I_{ds} = \beta[(V_{gs} - V_t)V_{ds} - V_{ds}^2/2]$ | $0 < V_{ds} < V_{gs} - V_t$ |
| Saturation: | $I_{ds} = \beta(V_{gs} - V_t)^2/2$ | $0 < V_{gs} - V_t < V_{ds}$ | where $\beta$ is the MOS transistor gain factor defined as $$\beta=(\mu\epsilon/t_{OX})(W/L)$$

$\mu$ is mobility, $\epsilon$ is the dielectric constant, $t_{OX}$ is the gate oxide thickness, W is width of the gate, and L is the length of the gate.

The properties discussed above are known as the primary current-voltage (I-V) characteristics of a MOS transistor. A MOS transistor also has second-order characteristics which may include nonlinear capacitance, floating capacitance, short channel effect, and body effect. These second order characteristics effect the operation of a transistor particularly for smaller components and circuits. As shown in FIGS. 3A and 3B, the capacitances of the transistors include the gate capacitance ($C_G$), drain capacitance ($C_D$), and source capacitance ($C_S$). The following are equations for these capacitances:

$$C_G = C_{gb} + C_{gs} + C_{gd},$$

$$C_D = C_{db}, \text{ and}$$

$$C_S = C_{sb}.$$

where $C_{gs}$ and $C_{gd}$ are the gate-to-channel capacitances that are lumped at the source 306 and drain 304 regions of the channel, respectively. $C_{sb}$ and $C_{db}$ represent the capacitance from the source 306 and drain 304 respectively to the bulk (i.e., the substrate) 308; and $C_{gb}$ is the gate-to-bulk capacitance.

Like $I_{ds}$, the values of $C_G$, $C_D$, and $C_S$ may depend on the transistor's region of operation. In the cutoff region ($V_{gs}$<$V_t$), both $C_{gs}$ and $C_{gd}$ equal 0, and $C_{gb}$ is $\epsilon A/t_{OX}$, where A represents the area of the gate, $\epsilon$ is the dielectric constant, and $t_{OX}$ 310 is the gate oxide thickness. In the linear region ($V_{gs}$-$V_t$>$V_{ds}$), $C_{gb}$ is 0 and both $C_{gd}$ and $C_{gs}$ are $\frac{1}{2}(\epsilon A/t_{OX})$. In the saturation region ($V_{gs}$-$V_t$<$V_{ds}$), $C_{gb}$ and $C_{gd}$ are 0 and $C_{gs}$ is $\frac{2}{3}(\epsilon A/t_{OX})$. Substituting these values into the equation for $C_G$, yields the following expression for $C_{gs}$ in the different regions:

| | |
|---|---|
| Cutoff: | $\epsilon A/t_{ox}$ |
| Linear: | $\epsilon A/t_{ox}$ |
| Saturation: | $\frac{2}{3}(\epsilon A/t_{ox})$ |

$C_S$ and $C_D$ are the capacitances due to diffusion for the source and drain respectively. All diffusion regions have a capacitance to the substrate that depends upon the voltage between the diffusion region and the substrate and the effective area of the depletion region separating the diffusion region and the substrate. In particular, the diffusion capacitance is proportional to the total area of the diffusion-to-substrate junction. The total capacitance for each area may be expressed as $$C=C_{ja}(ab)+C_{jp}(2a+2b), \qquad (1)$$

where $C_{ja}$ represents the junction capacitance, $C_{jp}$ expresses the periphery capacitance, and "a" and "b" represent the width and length of the diffusion regions. The expression for $C_S$ and $C_D$ in each region are as follows:

|       | Cutoff    | Linear                  | Saturation              |
|-------|-----------|-------------------------|-------------------------|
| $C_S$ | $C_{sb}$  | $C_{sb} + ½C_{jc}$      | $C_{sb} + ⅔C_{jc}$      |
| $C_D$ | $C_{db}$  | $C_{db} + ½C_{jc}$      | $C_{db}$                | where $C_{jc}$ is the capacitance between the channel and the substrate. The value for $C_S$ and $C_D$ is computed within a certain region, by computing C from equation (1) and substituting the value for C in $C_{sb}$ or $C_{db}$ respectively in the table.

The present invention includes models for the components that comprise a circuit. In one embodiment, the model partitions a space into different operating regions for its component. For each of these regions, the model comprises expressions that define values for the component's properties within that region. In one embodiment, these expressions are linear. The models further comprise expressions for the borders that partition the space into the different regions. In one embodiment, two or more of the properties share the same borders and therefore, the same regions.

Without limitation, many of the following embodiments of the models of the present invention are described in the illustrative context of models of MOSFET n-type transistors. But the aspects of the embodiments of the models of the invention are also applicable to other types of components such as p-type MOSFETs, bipolar transistors and so on. The aspects that are applicable in a wide range of contexts include models of circuit components having a plurality of properties that depend on at least two variables comprising: a space defined by the two or more variables; a partition of the space comprising a plurality of regions wherein at least two of the properties share the partition; and at least one definition representing at least one of the properties in at least one of the regions.

In one embodiment of the present invention, the model of the MOSFET includes current and charge. As previously explained, the effect of capacitance (the derivative of charge) on a transistor's operation increases as the size of the transistor decreases. Accordingly, the models of the present invention will continue to be useful as transistor sizes decrease with improvements in fabrication technology.

Figure 4A:
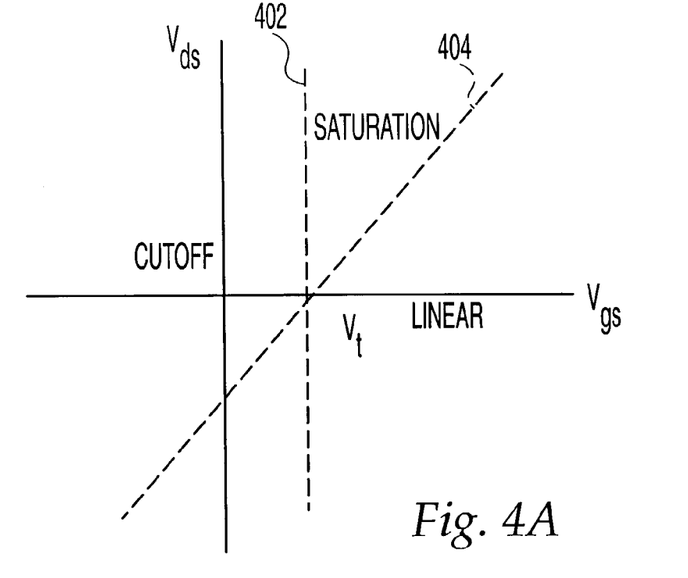
FIG. 4A illustrates one partition of a space defined by $V_{gs}$, $V_{ds}$ and $V_{bs}$.
Figure 4B:
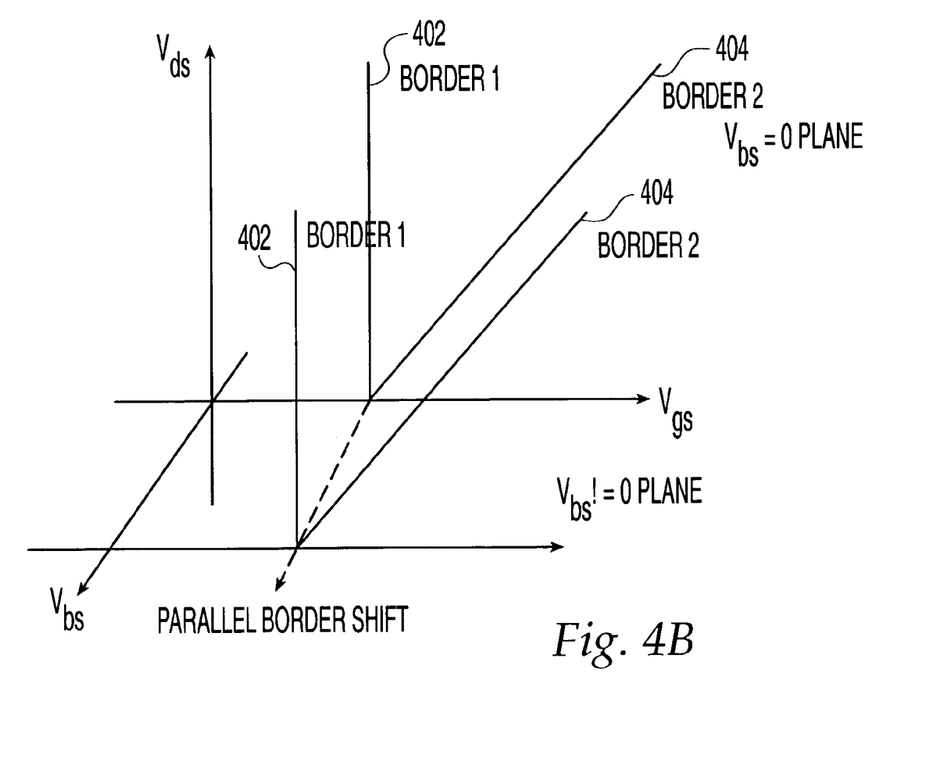
FIG. 4B illustrates the same partition in three dimensions.

The model of the MOSFET may partition the space into different regions. FIG. 4A illustrates one partition of a space defined by $V_{gs}$, $V_{ds}$ and $V_{bs}$, where $V_{bs}$ is the voltage between the bulk (substrate) and the source. FIG. 4A illustrates the partition in two dimensions. In particular, FIG. 4A shows only the $V_{gs}-V_{ds}$ plane for $V_{bs}=0$. In that figure, the x-axis and y-axis represent $V_{gs}$ and $V_{ds}$ respectively. FIG. 4B illustrates the same partition in three dimensions. In FIG. 4B, the x-axis, y-axis and z-axis represent $V_{gs}$, $V_{ds}$ and $V_{bs}$ respectively. The partition of FIGS. 4A and 4B has three regions: the cutoff region, the saturation region and the linear region. Each of these regions are enclosed by borders 402, 404. The equation of one border 402 is $V_{gs}=V_t$. And the equation of another border 404 is $V_{ds}=V_{gs}-V_t$.

In each region, the model comprises an expression for the current $I_{ds}$. In one embodiment, the expressions for $I_{ds}$ in each region are linear. In one embodiment, $I_{ds}$ is a linear function of $V_{gs}$, $V_{ds}$ and $V_{bs}$ in each region. In one embodiment, $I_{ds}$ is defined in each region as: $I_{ds}=g_mV_{gs}+g_{ds}V_{ds}+g_bV_{bs}+I_{dseq}$ where $g_m$ is the gate transconductance, $g_{ds}$ is the drain-source conductance, $g_b$ is the substrate transconductance and $I_{dseq}$ is the channel current when the voltages $V_{gs}$, $V_{ds}$ and $V_{bs}$ are zero. Transconductance is explained in "Transient Simulation of Integrated Circuits in the Charge Voltage Plane" by Anirudh Dergen, Transactions on Computer-Aided Design of Integrated Circuits and Systems, vol. 15, No. 11, November 1996, the contents of which are herein incorporated by reference. The values of the conductance and transconductances $g_m$, $g_{ds}$ and $g_b$ differ in each region.

In each region, the models of the present invention comprise an expression for the charge at each of the terminals for the MOSFET. As previously explained, a MOSFET has four terminals: the drain, gate, source and bulk (substrate). The principle of charge conservation indicates that the sum of the charges at the four terminal are zero: $Q_g+Q_d+Q_s+Q_b=0$. Because of the principle, only three of the four charges are independent. Accordingly, the model of the present invention may represent only three of the four charges. In one embodiment, the model represents the charge at the gate, drain and source of the MOSFET. In one embodiment, the expression for the charges in each region is linear. In one embodiment, the expression for the charge in each region is a linear function of $V_{gs}$, $V_{ds}$ and $V_{bs}$. In one embodiment, the charges are expressed as:

$$Q_g=C_{gx}V_{gs}+C_{gy}V_{ds}+C_{gz}V_{bs}+Q_{geq}$$
$$Q_d=C_{dx}V_{gs}+C_{dy}V_{ds}+C_{dz}V_{bs}+Q_{deq}$$
$$Q_s=C_{sx}V_{gs}+C_{sy}V_{ds}+C_{sz}V_{bs}+Q_{seq}$$

where $Q_g$ represent the charge at the gate;
$Q_d$ represent the charge at the drain;
$Q_s$ represents the charge at the source;
$C_{gx}$, $C_{gy}$, $C_{gz}$ are gate charge coefficients;
$C_{dx}$, $C_{dy}$, $C_{dz}$ are drain charge coefficients;
$C_{sx}$, $C_{sy}$, $C_{sz}$ are source charge coefficients;
$Q_{geq}$ is the charge at the gate when the voltages $V_{gs}$, $V_{ds}$ and $V_{bs}$ are zero;
$Q_{deq}$ is the charge at the drain when the voltages $V_{gs}$, $V_{ds}$ and $V_{bs}$ are zero; and
$Q_{seq}$ is the charge at the source when the voltages $V_{gs}$, $V_{ds}$ and $V_{bs}$ are zero.

Another embodiment of the model of the present invention represents additional characteristics of the MOSFET including short channel effect and body effect. Body effect is the variance in $V_t$ with respect to $V_{bs}$, the voltage difference between the bulk (substrate) and the source. This embodiment of the model accounts for these additional transistor characteristics with enhanced equations for the borders defining the regions. In particular, the enhanced equations for border 402 and border 404 respectively are:

$$V_{gs}+K_{d1}V_{ds}+K_{b1}V_{bs}-V_t=0 \text{ and}$$
$$V_{gs}+K_{d2}V_{ds}+K_{b2}V_{bs}-V_t=0$$

Where
$K_{d1}=-k_{sc}$;
$K_{d2}=-(k_{sc}+k_1)$;

$K_{b1}=K_{b2}=-k_b'$ $k_{sc}$ is the short channel presentation;

$k_1$ is the linear region conductance coefficient; and $k_b$ is the body effect parameter.

$K_{d1}/K_{d2}$ is a coefficient of the y-axis and $K_{b1}/K_{b2}$ is the coefficient of the z-axis.

Figure 5:
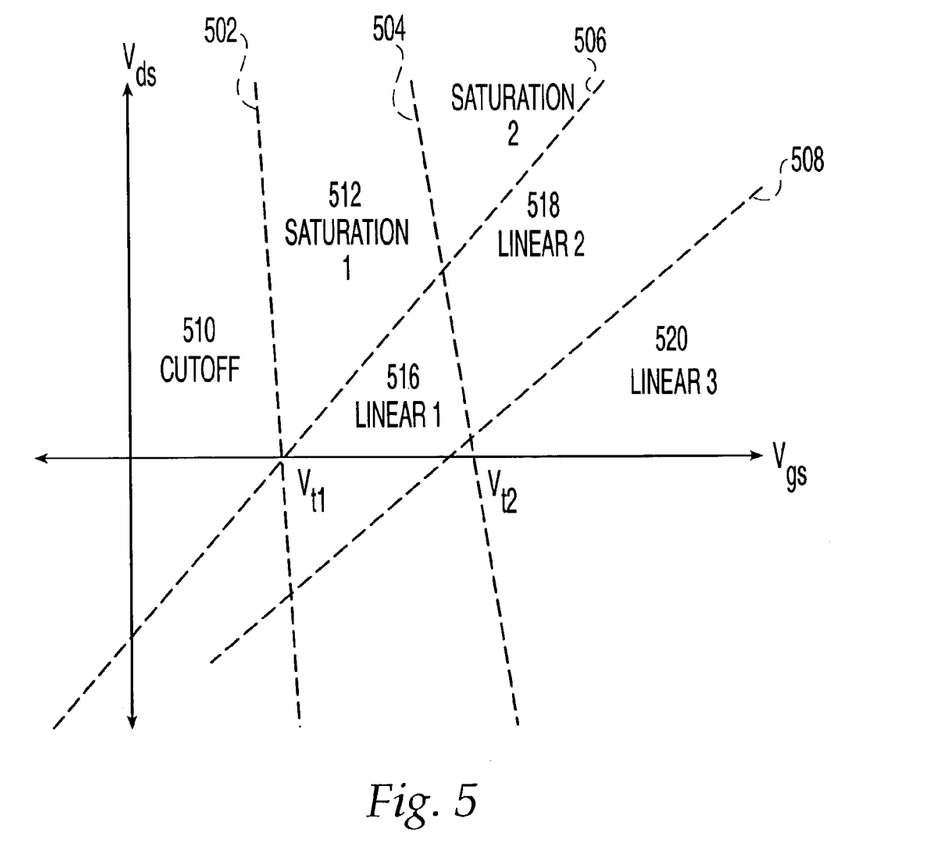
FIGS. 5 and 6 illustrate other partitions of the space having more regions that are formed by four and six borders respectively.

Other embodiments of the models of the present invention partition the space into more regions. These models may achieve greater accuracy in the simulation but may require more computing time to perform the simulation. FIG. 5 illustrates one such partition having six-regions of interest: cutoff region 510, a first saturation region 512, a second saturation region 514, a first linear region 516, a second linear region 518 and a third linear region 520. These regions are formed by four borders: 502, 504, 506, 508.

Figure 6:
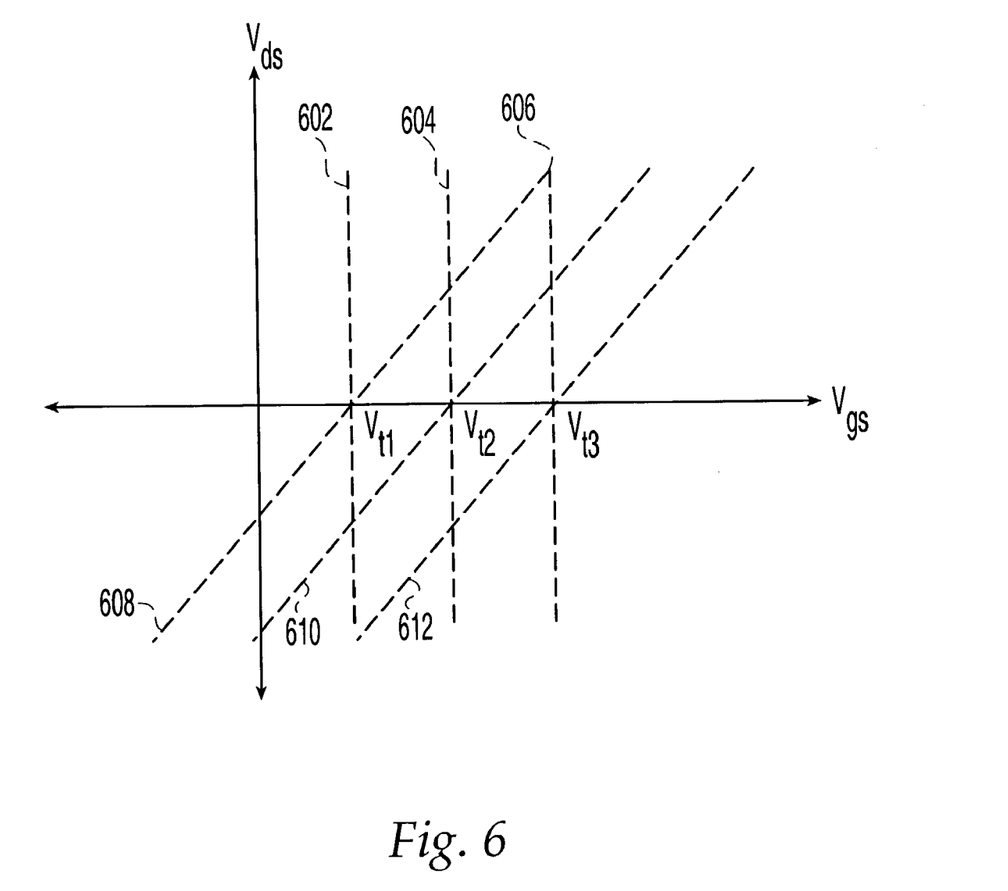

The equation for border 502 and border 504 is:

$$V_{gs}+K_{d1}V_{ds}+K_{b1}V_{bs}-V_t=0$$

where, for border 502, $K_{d1}=-k_{sc1}$ $K_{b1}=-k_{b1}$ $V_t=V_{t1}$ for border 504, $K_{d1}=-k_{sc2}$ $K_{b1}=-k_{b2}$ $V_t=V_{t2}$ The equation for border 506 and border 508 is:

$$V_{gs}+K_{d2}V_{ds}+K_{b2}V_{bs}-V_t=0$$

where, for border 506, $K_{d2}=-(k_{sc1}+k_{11})$ $K_{b2}=-k_{b1}$ $V_t=V_{t1}$ for border 508, $K_{d2}=-(k_{sc2}+k_{12})$ $K_{d2}=-k_{b2}$ $V_t=V_{t2}$ FIG. 6 illustrates another partition having more regions that are formed by six borders: 602, 604, 606, 608, 610 and 612. Another embodiment of the model of the present invention has a border along the z-coordinate, thereby creating multiple regions in the z direction.

Figure 7:
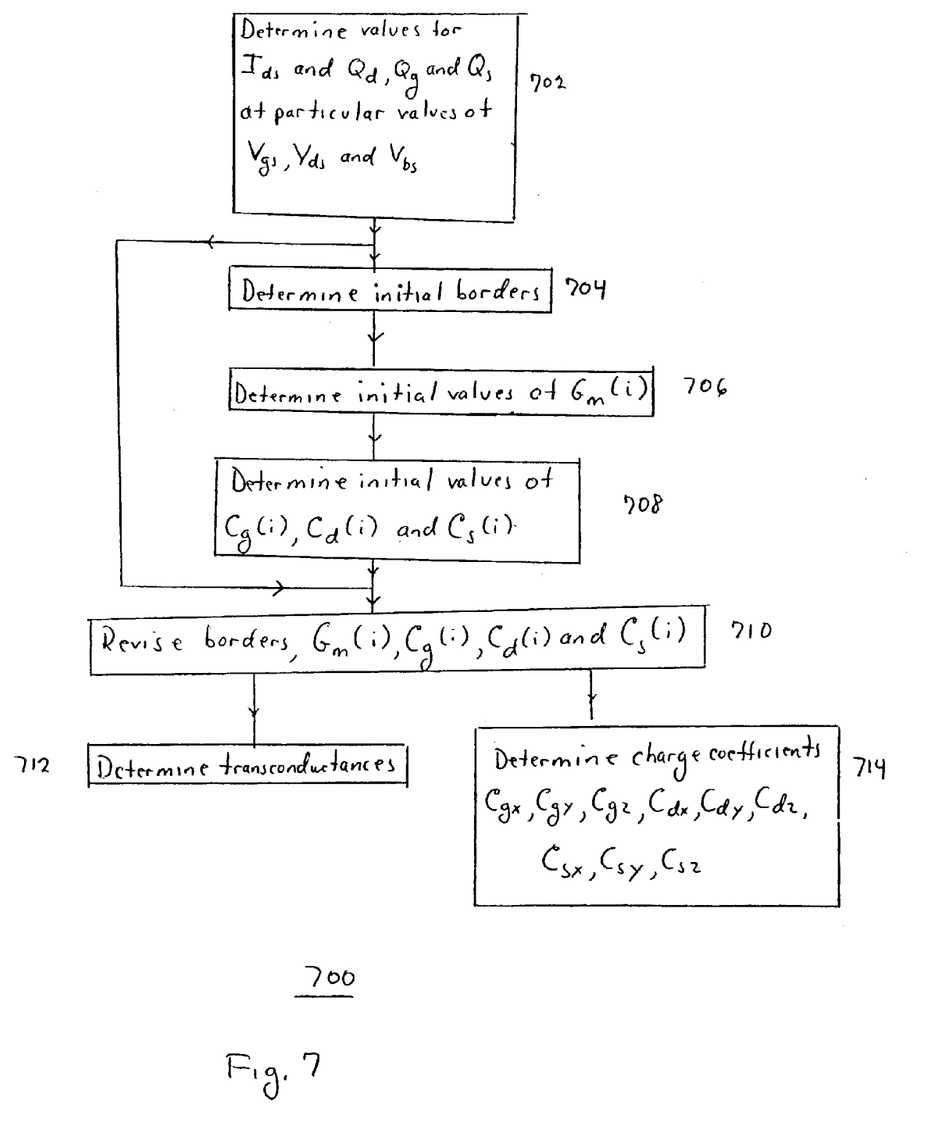
FIG. 7 is a dataflow diagram illustrating the method of constructing the models of the present invention.

FIG. 7 is a dataflow diagram illustrating the method of constructing the models of the present invention in 700. A dataflow diagram is a graph whose nodes are processes and whose arcs are dataflows as explained in *Object Oriented Modeling and Design*, Rumbaugh, J., Prentice Hall, Inc. (1991), Chapter 1, the contents of which are herein incorporated by reference. In step 702, a set of values of the current $I_{ds}$ and the charges $Q_d$, $Q_g$ and $Q_s$ at particular values of the voltages: $V_{gs}$, $V_{ds}$ and/or $V_{bs}$ is obtained. In one embodiment, the values for the current and the charges are obtained from non-linear equations. In step 704, initial borders for the regions are determined. In one embodiment, only the current $I_{ds}$ is considered in determining the initial borders. In another embodiment, both the current $I_{ds}$ and the charges $Q_g$, $Q_d$ and $Q_s$ are considered in determining the initial borders. In step 706, initial values for incremental transconductance $G_m(i)$ for each of the initial borders i= 1 . . . n are determined, where n is the number of initial borders. In step 708, initial values for the incremental capacitance at the gate $C_g(i)$, the incremental capacitance at the drain $C_d(i)$ and the incremental capacitance at the source $C_s(i)$ are determined for each of the initial borders. In step 710, an optimization is performed to revise the position of the borders, and to revise the values of the incremental transconductance $G_m(i)$ and the incremental capacitances, $C_g(i)$, $C_d(i)$, and $C_s(i)$ so that they best fit the set of values that were determined in step 702. In step 712, values for the gate transconductance $g_m$ the drain-source conductance $g_{ds}$ and the source transconductance $g_s$ in each region are determined from the borders and the incremental transconductances $G_m(i)$ at the borders i=1, . . . n. In step 714, values for the gate charge coefficients ($C_{gx}$, $C_{gy}$ and $C_{gz}$) the drain charge coefficients ($C_{dx}$, $C_{dy}$ ad $C_{dz}$) and the source charge coefficients ($C_{sx}$, $C_{sy}$ and $C_{sz}$) in each region are determined from the borders and the incremental gate capacitances $C_g(i)$, the incremental drain capacitances $C_d(i)$ and the incremental source capacitances $C_s(i)$ at the borders i=1, . . . n.

Figure 8:
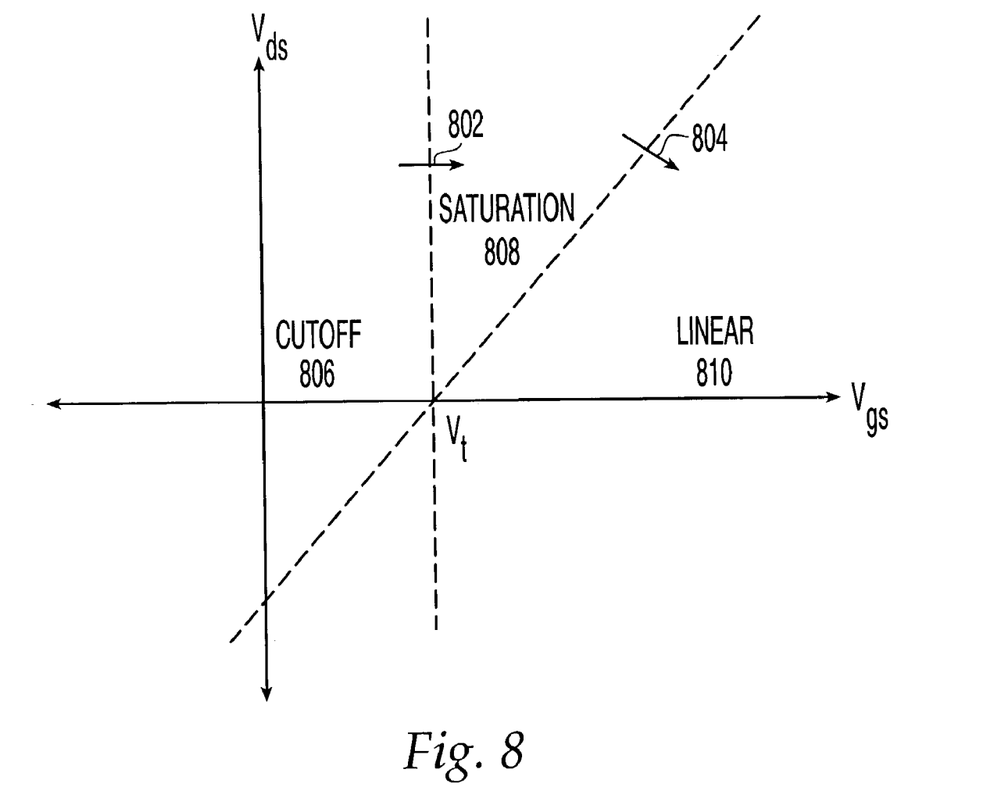
FIG. 8 shows a partition that is used to illustrate one embodiment of some of the steps from the method of FIG. 7.

FIG. 8 shows a partition to illustrate one embodiment of steps 712 and 714. The values for the gate transconductance $g_m$, the drain-source conductance $g_{ds}$, and the source transconductance $g_s$, are determined in the cutoff region 806. The values for the transconductances and conductance $g_m$, $g_{ds}$ and $g_s$ in the cutoff region 806 are adjusted in accordance with the incremental transconductances $G_m(1)$, $G_d(1)$ and $G_s(1)$ at the first border 802 to determine the values of the transconductances and conductance $g_m$, $g_{ds}$ and $g_s$ in the saturation region 808. The values for the transconductances and conductance $g_m$, $g_{ds}$ and $g_s$ in the saturation region 808 are adjusted by the incremental transconductances $G_m(2)$, $G_d(2)$ and $G_s(2)$ at the next border 804 to determine the transconductances in the linear region 810.

The values for the gate charge coefficients ($C_{gx}$, $C_{gy}$ and $C_{gz}$), the drain charge coefficients ($C_{dx}$, $C_{dy}$ and $C_{dz}$), and the source charge coefficient, ($C_{sx}$, $C_{sy}$ and $C_{sz}$) are determined in the cutoff region 806. The value for these charge coefficients are adjusted by the incremental capacitance at the gate $C_g(1)$, the drain $C_d(1)$ and the source $C_s(1)$ at the first border 802 to determine the values of the charge coefficients in the saturation region 808. The value of the charge coefficients in the saturation region 808 are adjusted by the incremental capacitance at the gate $C_g(2)$, the drain $C_d(2)$ and the source $C_s(2)$ at the next border 804 to determine the values of the charge coefficients in the linear region 810.

For partitions having more regions (i.e., FIGS. 5 and 6), this process can be repeated to determine the transconductances and the charge coefficients in each region. The transconductances for a region are adjusted by the incremental transconductances at the border to determine the transconductances in the region on the other side of the border. Likewise, the charge coefficients for a region are adjusted by the incremental capacitances at the border to determine the charge coefficients in the region on the other side of the border.

While the above invention has been described with reference to certain preferred embodiments, the scope of the present invention is not limited to these embodiments. One skilled in the art may find variations of these preferred embodiments which fall within the spirit of the present invention, whose scope is defined by the claims set forth below.

What is claimed is:

1. A model of a circuit component having a plurality of properties that depend on at least two parameters comprising:

a circuit characteristics graph defined by the two or more parameters, wherein the two or more parameters define at least voltages between two or more terminals of the circuit component;

a representation of said circuit characteristics graph comprising a plurality of regions, wherein a plurality of borders form a representation of said plurality of regions, wherein at least two of the properties share at least one of the regions, and wherein the properties define at least electrical charges at one or more terminals of the circuit component; and at least one definition representing at least one of the properties in at least one of the regions.

2. A model of a circuit component as in claim 1 wherein said at least one definition representing said at least one of the properties comprises an expression of said at least two parameters.

3. A model of a circuit component as in claim 2 wherein the component is a MOSFET transistor comprising a gate, a source and a drain.

4. A model of a circuit component as in claim 3 wherein said at least two independent parameters comprise two or more of the following: a voltage difference between the gate and the source, $V_{gs}$, and a voltage difference between the drain and the source, $V_{ds}$, and a voltage difference between the substrate and the source.

5. A model of a circuit component as in claim 3 wherein the properties comprise one or more of the following: a current between the drain and the source, $I_{ds}$, a charge at the gate $Q_g$, a charge at the source $Q_s$, and a charge at the drain $Q_d$.

6. A model of a circuit component as in claim 5 wherein said expression representing the current between the source and the drain is: $I_{ds}=g_m V_{gs}+g_{ds}V_{ds}+g_b V_{bs}+I_{dseq}$ where $g_m$ is gate transconductance, $g_{ds}$ is drain-source conductance, $g_b$ is substrate transconductance and $I_{dseq}$ is channel current when said voltages $V_{gs}$, $V_{ds}$ and $V_{bs}$ are zero.

7. A model of a circuit component as in claim 5 wherein said expression representing the charge at the gate is:

$$Q_g = C_{gx}V_{gs}+C_{gy}V_{ds}+C_{gz}V_{bs}+Q_{geq}$$

where $Q_g$ represent the charge at the gate;

$C_{gx}$, $C_{gy}$, $C_{gz}$ are gate charge coefficients; and $Q_{req}$ is the charge at the gate when the voltages $V_{gs}$, $V_{ds}$ and $V_{bs}$ are zero.

8. A model of a circuit component as in claim 5 wherein said expression representing the charge at the drain is:

$$Q_d = C_{dx}V_{gs}+C_{dy}V_{ds}+C_{dz}V_{bs}+Q_{deq}$$

where $Q_d$ represents the charge at the drain;

$C_{dx}$, $C_{dy}$, $C_{dz}$ are drain charge coefficients; and $Q_{deq}$ is the charge at the drain when the voltages $V_{gs}$, $V_{ds}$ and $V_{bs}$ are zero.

9. A model of a circuit component as in claim 5 wherein said expression representing the charge at the source is:

$$Q_s = C_{sx}V_{gs}+C_{sy}V_{ds}+C_{sz}V_{bs}+Q_{seq}$$

where $Q_s$ represents the charge at the source;

$C_{sx}$, $C_{gy}$, $C_{sz}$, are source charge coefficients; and $Q_{seq}$ is the charge at the source when the voltages $V_{gs}$, $V_{ds}$ and $V_{bs}$ are zero.

10. A method for creating a model of a circuit component having a plurality of properties that depend on two or more parameters comprising the steps of:

defining a circuit characteristics graph by the two or more parameters, wherein the two or more parameters define at least voltages between two or more terminals of the circuit component:

determining a plurality of borders forming a representation of said circuit characteristics graph comprising a plurality of regions, wherein at least two of the properties share at least one of the regions, and wherein the properties define at least electrical charges atone or more terminals of the circuit component; and determining at least one definition representing at least one of the properties in at least one of the regions.

11. A method for creating a model of a circuit component as in claim 10 wherein the circuit component is a MOSFET transistor comprising a gate, a source, and a drain.

12. A method for creating a model of a circuit component as in claim 11 further comprising the step of determining a set of values for at least one of the properties at predetermined values of the two or more independent parameters.

13. A method for creating a model of a circuit component as in claim 12 wherein said determining a plurality of borders step comprises the steps of:

determining a plurality of initial borders;

revising said plurality of initial borders to match said set of values for said at least one property.

14. A method for creating a model of a circuit component as in claim 13 wherein said determining at least one definition representing said at least one property step comprises the steps:

defining at least one incremental variable at at least one of said plurality of borders, wherein the incremental variable is a variable selected from the group consisting of a gate charge coefficient, a drain charge coefficient, a source charge coefficient, a gate transconductance, a drain transconductance, and a source transconductance;

determining an initial value for said at least one incremental variable;

revising said initial value for said at least one incremental variable to match said set of values for said at least one property.

15. A method for creating a model of a circuit component as in claim 14 wherein the plurality of properties comprise one or more of the following: a current between the source and the drain, a charge at the gate, a charge at the drain and a charge at the source.

16. A method for creating a model of a circuit component as in claim 14 wherein said determining at least one definition representing at least one of the properties step comprises the step of determining an expression of said at least one property, said expression comprising one or more of the following variables: a gate charge coefficient, a drain charge coefficient, a source charge coefficient, a gate transconductance, a drain transconductance, and a source transconductance.

17. A method for creating a model of a circuit component as in claim 16 wherein said representing at least one property step further comprises the steps of:

traversing the circuit characteristics graph; and upon crossing said at least one border, determining at least one value for at least one of said variables in said at least one region from said at least one border and said revised value of said at least one incremental variable at said at least one border.

18. A model of a circuit component having a plurality of properties that depend on at least two parameters, the model stored on a computer-readable medium for use by a simulator, the model comprising:

a circuit characteristics graph defined by the two or more parameters, wherein the two or more parameters define at least voltages between two or more terminals of the circuit component;

a representation of said circuit characteristics graph comprising a plurality of regions, wherein a plurality of borders form a representation of said plurality of regions, wherein at least two of the properties share at least one of the regions, and wherein the properties define at least electrical charges at one or more terminals of the circuit component; and at least one definition representing at least one of the properties in at least one of the regions.

19. Computer executable software code stored on a computer readable medium, the code for creating a model of a circuit component having a plurality of properties that depend on two or more parameters, the code comprising:

code to define a circuit characteristics graph of the two or more parameters where the two or more parameters define at least voltages between two or more terminals of the circuit component;

code to determine a plurality of borders forming a representation of said circuit characterstics graph comprising a plurality of regions, wherein at least two of the properties share at least one of the regions, and wherein the properties define at least electrical charges at one or more terminals of the circuit component; and code to determine at least one definition representing at least one of the properties in at least one of the regions.

20. A programmed computer system for creating a model of a circuit component having a plurality of properties that depend on two or more parameters comprising at least one memory having at least one region storing computer executable program code and at least one processor for executing the program code stored in said memory, wherein the program code includes:

code to define a circuit characteristics graph of the two or more parameters, wherein the two or more parameters define at least voltages between two or more terminals of the circuit component;

code to determine a plurality of borders forming a representation of said circuit characteristics graph comprising a plurality of regions, wherein at least two of the properties share at least one of the regions, and wherein the properties define at least electrical charges at one or more terminals of the circuit component; and code to determine at least one definition representing at least one of the properties in at least one of the regions.

* * * * *